(12) United States Patent
Adebiyi et al.

(10) Patent No.: US 11,441,416 B2
(45) Date of Patent: Sep. 13, 2022

(54) COOLING DOWNHOLE EQUIPMENT

(71) Applicant: Saudi Arabian Oil Company, Dhahran (SA)

(72) Inventors: Ismail Adebiyi, Dhahran (SA); Ziyad Alsahlawi, Dhahran (SA); Ossama R. Sehsah, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 2 days.

(21) Appl. No.: 16/787,888

(22) Filed: Feb. 11, 2020

(65) Prior Publication Data

US 2021/0246779 A1    Aug. 12, 2021

(51) Int. Cl.
| | |
|---|---|
| *E21B 47/01* | (2012.01) |
| *E21B 47/017* | (2012.01) |
| *E21B 47/07* | (2012.01) |
| *E21B 49/00* | (2006.01) |
| *H05K 7/20* | (2006.01) |

(52) U.S. Cl.
CPC ............ *E21B 47/017* (2020.05); *E21B 47/07* (2020.05); *E21B 49/00* (2013.01); *H05K 7/20272* (2013.01); *H05K 7/20281* (2013.01)

(58) Field of Classification Search
CPC .... E21B 47/017; E21B 47/07; E21B 47/0175; E21B 49/00; H05K 7/20281; H05K 7/20272
See application file for complete search history.

(56) References Cited

U.S. PATENT DOCUMENTS

| | | | |
|---|---|---|---|
| 2,671,323 A | 3/1951 | Richert | |
| 2,711,084 A * | 6/1955 | Allard | G01V 5/04 62/259.2 |
| 4,287,957 A | 9/1981 | Evans | |
| 4,407,136 A | 10/1983 | Kanter | |
| 4,955,237 A * | 9/1990 | Suzuki | E21B 25/08 73/784 |
| 5,265,677 A * | 11/1993 | Schultz | E21B 47/017 166/57 |
| 7,806,173 B2 | 10/2010 | Kaul et al. | |
| 2008/0223579 A1 | 9/2008 | Goodwin | |
| 2011/0146967 A1 * | 6/2011 | Winslow | E21B 47/017 166/57 |

(Continued)

FOREIGN PATENT DOCUMENTS

WO    WO 2012155018    11/2012

OTHER PUBLICATIONS

PCT International Search Report and Written Opinion in International Appln. No. PCT/US2021/017047, dated May 10, 2021, 20 pages.

*Primary Examiner* — Abby J Flynn
*Assistant Examiner* — Yanick A Akaragwe
(74) *Attorney, Agent, or Firm* — Fish & Richardson P.C.

(57) ABSTRACT

Logging electronics are housed within a tool housing. A first coolant reservoir is housed within the tool housing. A second coolant reservoir is housed within the tool housing. A tubing length defines a coolant passage. The tubing length fluidically connects the first coolant reservoir to the second coolant reservoir. A portion of the tubing length is adjacent to the logging electronics. A flow regulator is within the coolant passage. The flow regulator regulates a coolant flow between the first coolant reservoir and the second coolant reservoir.

19 Claims, 5 Drawing Sheets

(56) References Cited

U.S. PATENT DOCUMENTS

| | | | |
|---|---|---|---|
| 2013/0104572 A1* | 5/2013 | DiFoggio | E21B 36/001 62/259.4 |
| 2014/0116071 A1 | 5/2014 | Jung et al. | |
| 2015/0345254 A1 | 12/2015 | Ciglenec et al. | |
| 2016/0076339 A1* | 3/2016 | Martin | E21B 47/017 166/57 |
| 2017/0284194 A1* | 10/2017 | Logan | E21B 47/20 |
| 2020/0199968 A1* | 6/2020 | Manett | F16K 5/08 |

* cited by examiner

COOLING DOWNHOLE EQUIPMENT

TECHNICAL FIELD

This disclosure relates to cooling downhole electronics.

BACKGROUND

Wireline logging tools are used to collect information regarding a geologic formation in which a wellbore has been formed to evaluate hydrocarbon potential. Wireline logging tools are housed in cylindrical tubes to protect electrical components. The electrical system used in logging tools can include multiple sensors, circuit boards, power sources, and in some cases, radioactive sources.

SUMMARY

This disclosure describes technologies relating to cooling downhole electronics.

An example implementation of the subject matter described within this disclosure is a wellbore logging tool with the following features. Logging electronics are housed within a tool housing. A first coolant reservoir is housed within the tool housing. A second coolant reservoir is housed within the tool housing. A tubing length defines a coolant passage. The tubing length fluidically connects the first coolant reservoir to the second coolant reservoir. A portion of the tubing length is adjacent to the logging electronics. A flow regulator is within the coolant passage. The flow regulator regulates a coolant flow between the first coolant reservoir and the second coolant reservoir.

Aspects of the example implementation, which can be combined with the example implementation alone or in combination, include the following. A temperature sensor is within the tool housing. The temperature sensor is configured to produce a temperature signal stream indicative of a temperature of the logging electronics.

Aspects of the example implementation, which can be combined with the example implementation alone or in combination, include the following. A controller is configured to receive the signal stream indicative of the temperature of the logging electronics. The controller is configured to determine that the temperature of the logging electronics is greater than a temperature threshold. The controller is configured to adjust the flow regulator to flow coolant through the tubing responsive to determining that the temperature of the logging electronics is greater than a temperature threshold.

Aspects of the example implementation, which can be combined with the example implementation alone or in combination, include the following. The controller is further configured to determine that the temperature of the logging electronics is less than a temperature threshold and adjust the flow regulator to cease coolant flow through the tubing.

Aspects of the example implementation, which can be combined with the example implementation alone or in combination, include the following. The controller is further configured to receive the signal stream indicative of the temperature of the logging electronics after the coolant has been flowing for a pre-determined duration of time. The controller is further configured to determine that the temperature of the logging electronics is greater than the temperature threshold. The controller is further configured to and deactivate downhole electronics within the logging tool responsive to the temperature of the logging electronics being greater than the temperature threshold.

Aspects of the example implementation, which can be combined with the example implementation alone or in combination, include the following. The flow regulator includes a compressor configured to flow the coolant between the first coolant reservoir and the second coolant reservoir.

Aspects of the example implementation, which can be combined with the example implementation alone or in combination, include the following. The flow regulator includes a valve configured to flow the coolant between the first coolant reservoir and the second coolant reservoir.

Aspects of the example implementation, which can be combined with the example implementation alone or in combination, include the following. The valve includes a ball valve or butterfly valve.

Aspects of the example implementation, which can be combined with the example implementation alone or in combination, include the following. The valve includes Inconel.

Aspects of the example implementation, which can be combined with the example implementation alone or in combination, include the following. The coolant includes carbon dioxide.

Aspects of the example implementation, which can be combined with the example implementation alone or in combination, include the following. The tubing length includes a coiled section encircling the logging electronics.

Aspects of the example implementation, which can be combined with the example implementation alone or in combination, include the following. The tubing length is a first tubing length and the coolant passage is a first coolant passage. The wellbore logging tool further includes a second tubing length defining a second coolant passage. The tubing length fluidically connects the first coolant reservoir to the second coolant reservoir. A check valve is within the first coolant passage or the second coolant passage. The check valve is arranged such that the coolant flows in only a single direction through the first coolant reservoir, the first tubing length, the second coolant reservoir, and the second coolant passage.

An example implementation of the subject matter described within this disclosure is a method with the following features. A downhole logging tool is received by a wellbore. A target temperature range is maintained within the downhole logging tool. Maintaining a target temperature includes receiving a signal stream, from a temperature sensor, indicative of a temperature of logging electronics within the logging tool. The temperature of the logging electronics is determined to be greater than a temperature threshold. A coolant flow rate within the logging tool is adjusted responsive to determining that the temperature of the logging electronics is greater than a temperature threshold.

Aspects of the example implementation, which can be combined with the example implementation alone or in combination, include the following. Maintaining a target temperature includes determining that the signal stream indicative of the temperature of the logging electronics is less than a temperature threshold and ceasing the coolant flow within the logging tool.

Aspects of the example implementation, which can be combined with the example implementation alone or in combination, include the following. Maintaining a target temperature includes receiving the signal stream indicative of the temperature of the logging electronics after the coolant has been flowing for a pre-determined duration of time. The temperature of the logging electronics is determined to be greater than the temperature threshold. The logging electronics within the logging tool are deactivated responsive to the temperature of the logging electronics being greater than the temperature threshold.

An example implementation of the subject matter described within this disclosure is a wellbore logging system with the following features. Logging electronics are within a logging tool housing. A temperature sensor is within the tool housing. The temperature sensor is configured to produce a temperature signal stream indicative of a temperature of the logging electronics. A cooling system is within the housing. The cooling system includes the following features. A first coolant reservoir is housed within the tool housing. A second coolant reservoir is housed within the tool housing. A tubing length defines a coolant passage. The tubing length fluidically connects the first coolant reservoir to the second coolant reservoir. A flow regulator is within the coolant passage. The flow regulator regulates a coolant flow between the first coolant reservoir and the second coolant reservoir. A controller is electronically coupled to the logging electronics, the temperature sensor, and the cooling system. The controller is configured do the following. The signal stream indicative of the temperature of the logging electronics is received by the controller. The temperature of the logging electronics is determined to be greater than a temperature threshold. The flow regulator is adjusted to flow coolant through the tubing.

Aspects of the example implementation, which can be combined with the example implementation alone or in combination, include the following. The flow regulator includes a compressor configured to flow the coolant between the first coolant reservoir and the second coolant reservoir.

Aspects of the example implementation, which can be combined with the example implementation alone or in combination, include the following. The flow regulator includes a restriction orifice.

Aspects of the example implementation, which can be combined with the example implementation alone or in combination, include the following. The coolant comprises ammonia or nitrogen.

Aspects of the example implementation, which can be combined with the example implementation alone or in combination, include the following. The tubing length includes a coiled section surrounding the logging electronics.

Particular implementations of the subject matter described in this disclosure can be implemented so as to realize one or more of the following advantages: mean time between failures of downhole logging equipment is reduced; and maintaining a temperature of the electronics increases the likelihood of recoverable data in the event of an over temperature event.

The details of one or more implementations of the subject matter described in this disclosure are set forth in the accompanying drawings and in the description. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

The electronic components of logging tools for use within a wellbore generate heat as they operate. For example, up to 20 watts of heat can be produced for the duration of logging operations. In addition to the heat produced by the electronics, temperature in wellbores increases as logging tools travel deeper into the wellbore. For example, if a wellbore is 16,000 feet deep with a temperature gradient of 1.85° Fahrenheit (F) per 100 feet, the bottom-hole temperature will be around 371° F. Such temperatures can exceed the maximum operating temperature of many logging tool components.

Collecting data on the geologic formation is useful to evaluate the hydrocarbon production potential of a reservoir. As the data is collected, fluid within the wellbore transfers heat from the downhole formation into the logging tool. The logging tool is covered by a housing which will transfer the heat to the electric system. In such an environment, the increased temperature may lead to electric failure resulting in Non Productive Time (NPT).

This disclosure relates to an active cooling device for logging tools that is self-contained within a logging sub. That is, the cooling device is contained entirely within the logging tool without circulating any cooling media to a topside facility. The cooling device includes a cooling agent container connected to a first end of a tubing coil that runs adjacent to the logging tool electronics. A sump container is positioned at an opposite end of the tubing coil to receive the used cooling agent. The cooling device can be actively controlled to regulate the temperature of the logging tool within a desired temperature range. In some implementations, the cooling agent is dry ice or a similar substance.

Figure 1:
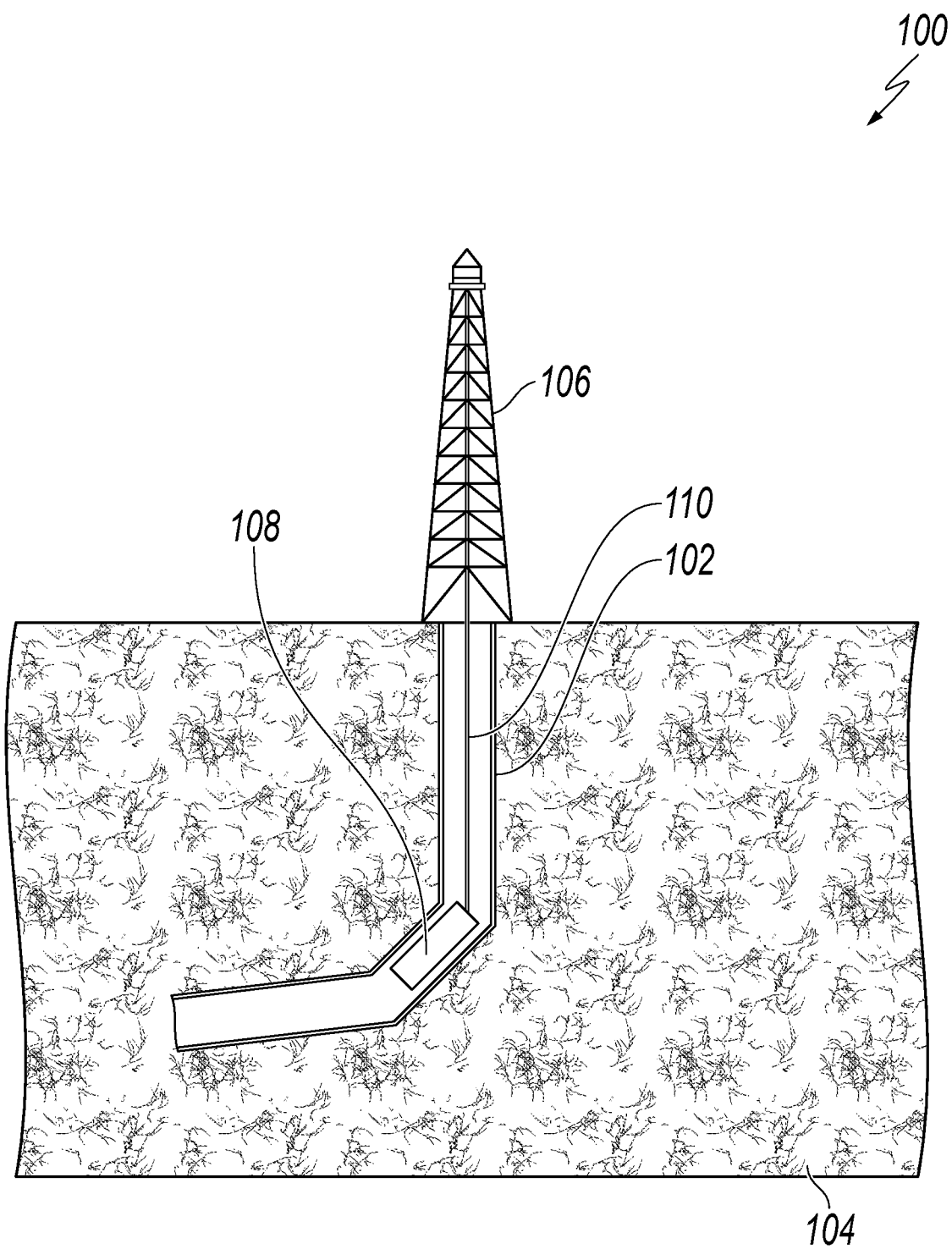
FIG. 1 is a side cross-sectional diagram of an example wellsite.

FIG. 1 is a side cross-sectional diagram of an example wellsite 100. The example wellsite 100 includes a wellbore 102 formed within a geologic formation 104. At the uphole end of the wellbore is a topside facility with a derrick 106 that can be used to support equipment going into and out of the wellbore 102. As illustrated, a logging tool 108 is deployed within the wellbore 102 with a wireline or e-line 110. The logging tool 108 takes detailed measurements, such as resistivity, acoustic timing, radiation responses, pressure, density and any other data that can be beneficial in analyzing the wellbore 102, geologic formation 104, or both. In some instances, neutron readings and direct fluid sample can also be taken.

Figure 2A:
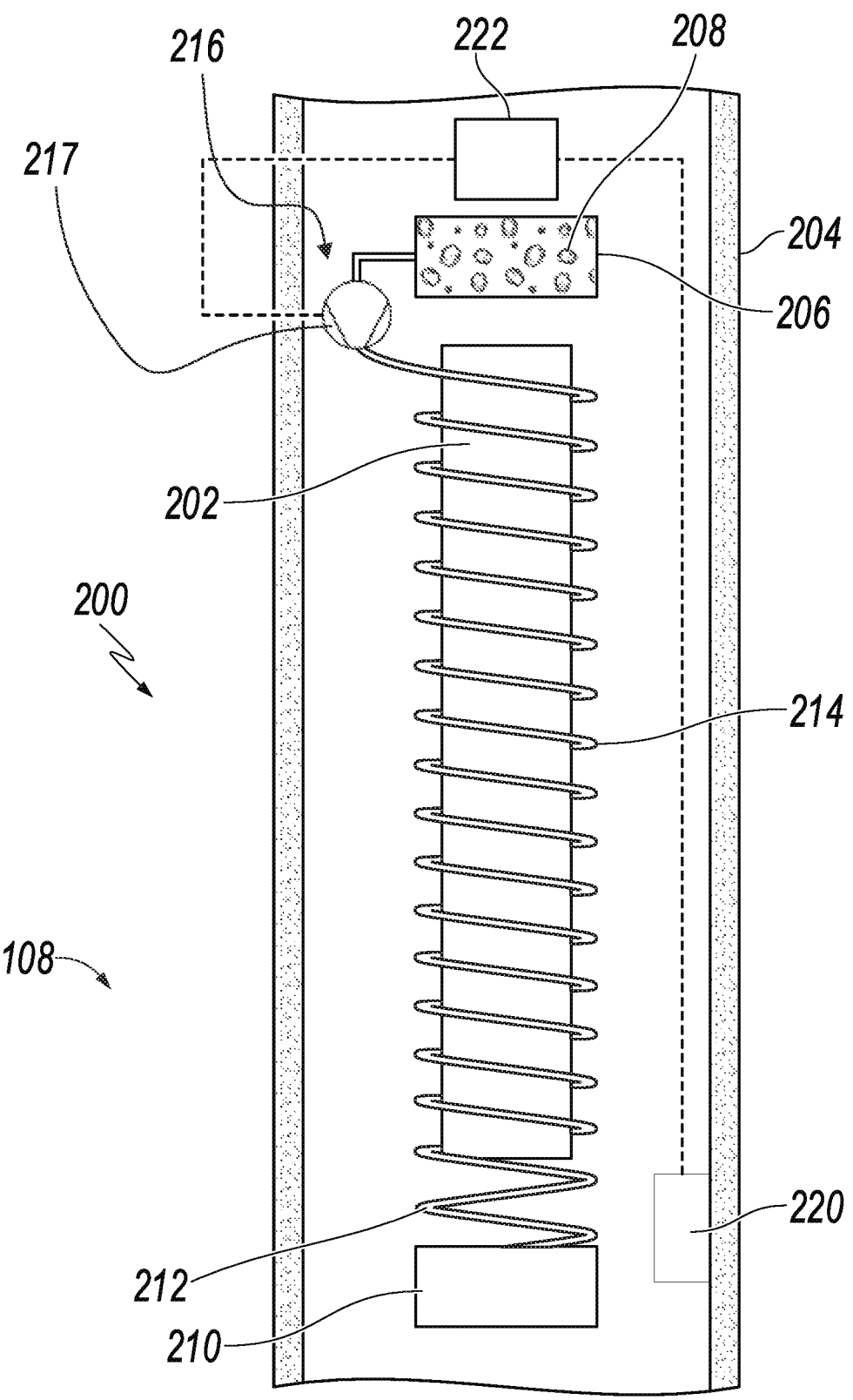
FIG. 2A is a side cross-sectional diagram of an example downhole electronic cooling system.

FIG. 2A is a side cross-sectional diagram of an example downhole electronic cooling system 200. In this example, the logging tool 108 includes logging electronics 202 housed within a tool housing 204. A first coolant reservoir 206 is housed within the tool housing 204. In some implementations, a coolant 208 housed within the first coolant reservoir 206 can include carbon dioxide, such as dry ice. In some implementations, other cooling mediums can be used, such as ammonia, liquid nitrogen, or any other coolant with sufficient cooling efficiency for the services described herein. While illustrated as being positioned at an uphole end of the tool housing 204, the first coolant reservoir 206 can be positioned anywhere within the tool housing 204 that does not create an interference.

A second coolant reservoir 210 is housed within the tool housing 204. While illustrated as being positioned at a downhole end of the tool housing 204, the second coolant reservoir 210 can be positioned anywhere within the tool housing 204 that does not create an interference. A tubing length 212 defines a coolant passage that fluidically connects the first coolant reservoir 206 to the second coolant reservoir 210. In some implementations, the second coolant reservoir 210 acts as a sump or collector, receiving the coolant 208 flowing from the first coolant reservoir 206 and through the tubing length 212. The length of tubing 212 includes at least a portion that is adjacent to the logging electronics 202. In some implementations, the tubing length 212 can include a coiled section 214 encircling the logging electronics 202. The number of coils is dependent upon the intended cooling load. In some implementations, other patterns can be alternatively or additionally used. For example, repeated longitudinal flow paths can be used. In general, any flow path shaping can be used so long as it fits within the confines defined by an outer surface of the logging electronics 202 and an inner surface of the tool housing 204.

A flow regulator 216 is located within the coolant passage. The flow regulator 216 regulates the coolant flow between the first coolant reservoir 206 and the second coolant reservoir 210. The flow regulator 216 can include a compressor 217 or pump configured to flow the coolant 208 between the first coolant reservoir 206 and the second coolant reservoir 210. Alternatively or in addition, the flow regulator 216 can include a valve configured to throttle the flow of the coolant 208 between the first coolant reservoir 206 and the second coolant reservoir 210. In such implementations, the valve can include a ball valve or butterfly valve. In some implementations, the flow regulator 216 can include a restriction orifice. Regardless of the components within the flow regulator 216, robust materials, such as Inconel, can be used to handle the temperature fluctuations that can be experienced during operation. In some implementations, the cooling system 200 can include an environmental vent valve 218 that can vent cooling fluid into the wellbore if necessary.

In some implementations, the cooling system 200 includes a temperature sensor 220 within the tool housing 204. The temperature sensor 220 is configured to produce a temperature signal stream indicative of a temperature of the logging electronics 202. A controller 222 is electronically coupled to the logging electronics 202, the temperature sensor 220, and the cooling system 200, for example, the flow regulator 216. Details about the controller 222 are described later within this disclosure.

Figure 2B:
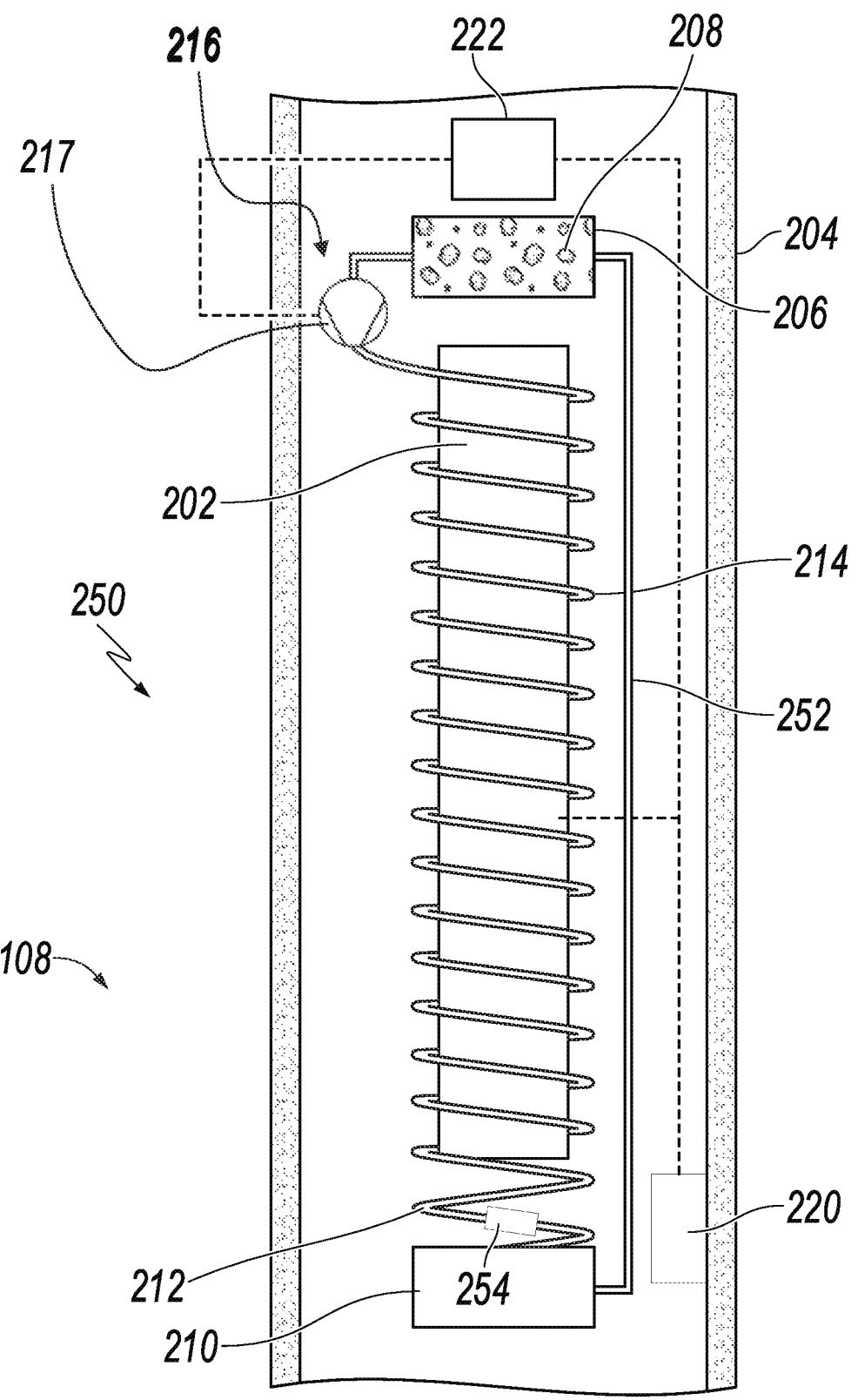
FIG. 2B is a side cross-sectional diagram of an example downhole electronic cooling system.

FIG. 2B is a side cross-sectional diagram of an example downhole electronic cooling system 250. The downhole electronic cooling system 250 is substantially similar to the electronic cooling system 200 with the exception of any differences described herein. The downhole electronics cooling system 250 includes a second tubing length 252 fluidically connecting the first coolant reservoir 206 with the second coolant reservoir 210. Flow regulators can be included within the second tubing length 252 in addition to or as an alternative to the flow regulator 216.

A second tubing length 252 defines a second coolant passage fluidically connecting the first coolant reservoir 206 to the second coolant reservoir 210. A check valve 254 is located within the first coolant passage or the second coolant passage such that the coolant 208 flows in only a single direction through the first coolant reservoir 206, the first tubing length 212, the second coolant reservoir 210, and the second tubing length 252. Such an implementation is a closed-loop system that recirculates the coolant 208 throughout the system. In some implementations, the closed loop system can include a heat exchanger, expander, or other phase change or heat transfer components. In some implementations, the system can be designed to utilize the Carnot or Stirling cycle for cooling operations.

Figure 3:
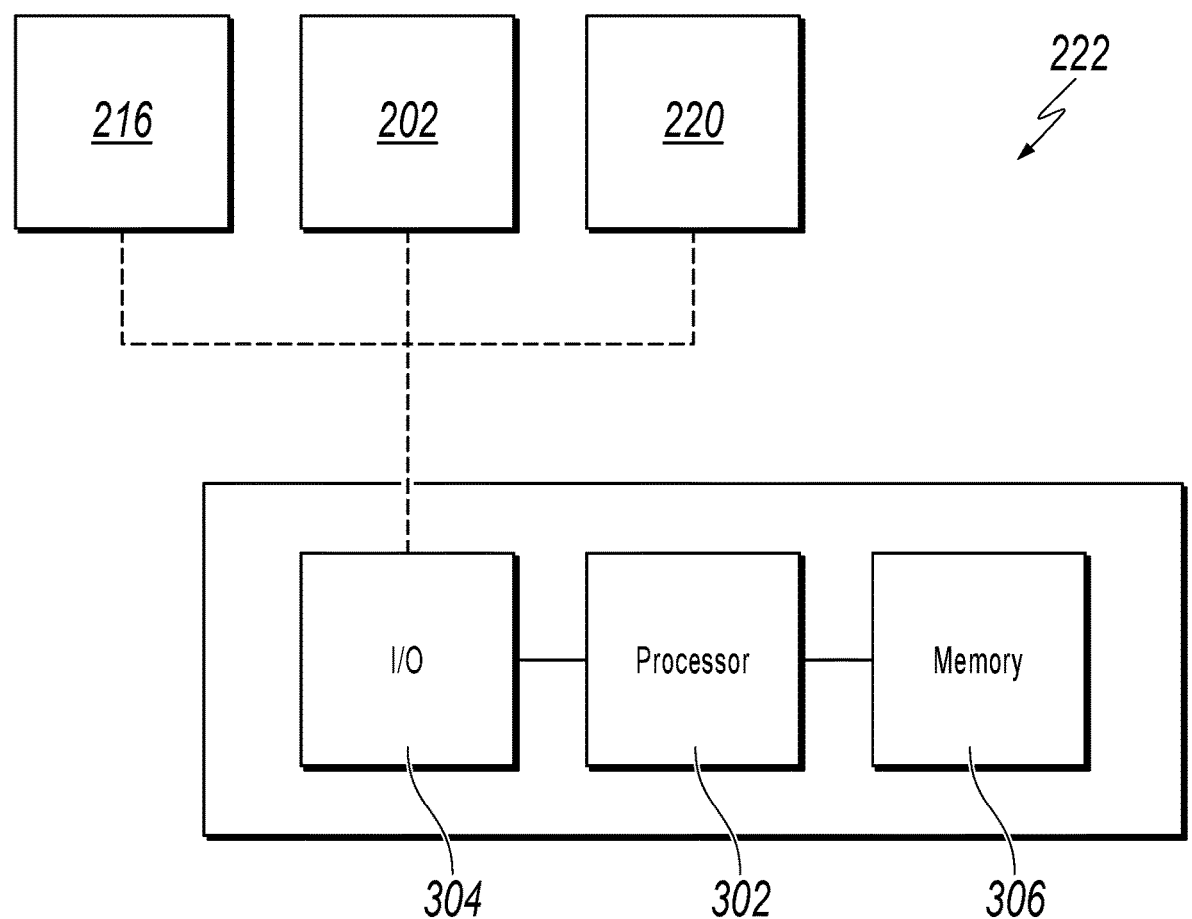
FIG. 3 is a block diagram of an example controller that can be used with aspects of this disclosure.

As shown in FIG. 3, the cooling system 200 can include a controller 222 to monitor, among other things, the temperature of the logging electronics 202, and to send signals to activate and deactivate the cooling system 200. As shown in FIG. 3, the controller 222 can include a processor 302 (implemented as one or more local or distributed processors) and a non-transitory storage media (for example, memory 306—implemented as one or more local or distributed memories) containing instructions that cause the processor 302 to perform the methods described herein. The processor 302 is coupled to an input/output (I/O) interface 304 for sending and receiving communications with other equipment of the wellsite 100 (FIG. 1) via communication links. In certain instances, the controller 222 can communicate status with and send actuation and control signals to one or more of the flow regulator 216, actuable valves, or logging electronics 202, as well as various sensors (such as, temperature sensor 220) at the wellsite 100. In certain instances, the controller 222 can communicate status to one or more of the systems at the topside facility. The communications can be hard-wired, wireless, or a combination of wired and wireless. In some implementations, the controller 222 can be located remote from the cooling system 200, such as in a data van, at the topside facility, downhole within the wellbore 102, or even remote from the wellsite 100 (such as at a central monitoring facility for monitoring and controlling multiple wellsites). In some implementations, the controller 222 can be a distributed controller with different portions located about the cooling system 200 or off site. For example, in certain instances, a portion of the controller 222 can be distributed among individual logging electronics 202, while another portion of the controller 222 can be located within a data van or control room.

The controller 222 can operate in monitoring, controlling, and using the cooling system 200 for maintaining a temperature for the logging electronics 202. To monitor and control the cooling system 200, the controller 222 is used in conjunction with sensors to measure the temperature of the logging electronics 202 within the logging tool 108. Input and output signals, including the data from the sensors, valves, and flow regulators, controlled and monitored by the controller 222, can be logged continuously by the controller 222.

For example, an operator, via the controller 222, can initiate logging and cooling operations. For example, the memory 306 can include instructions for the processor 302 to receive the signal stream indicative of the temperature of the logging electronics 202. After the stream is received, the temperature of the logging electronics 202 may be determined to be greater than a temperature threshold. For example, the temperature threshold can be 270° F., while the temperature is determined to be 350° F. Responsive to determining that the temperature of the logging electronics 202 is greater than a temperature threshold, the instructions can include adjusting the flow regulator 216 to flow coolant 208 through the tubing.

In some implementations, the memory 306 can include instructions for the processor 302 to determine that the temperature of the logging electronics 202 is less than a temperature threshold and adjust the flow regulator 216 to cease coolant flow through the tubing.

In some implementations, the memory 306 can include instructions for the processor 302 to receive the signal stream indicative of the temperature of the logging electronics 202 after the coolant 208 has been flowing for a pre-determined duration of time and determine that the temperature of the logging electronics 202 is greater than the temperature threshold. In response to the temperature of the logging electronics 202 being greater than the temperature threshold, logging electronics 202 can be deactivated by the controller 222.

In some implementations, a human operator can operate the controller 222, and thus the resulting physical steps, at a safe distance from the wellbore 102, far enough that if there were a leak or failure, the operator would not be injured. The operation can be effectuated via a terminal or other control interface associated with the controller 222. In certain instances, the operator, via controller 222, actuates a fully automated sequence run by the controller 222 to perform the steps described herein (that is, the operator just presses start, or a similar command, and the controller 222 performs autonomously). Alternatively, the operator, via controller 222, commands one or more of the individual, later described steps. In either instance, the terminal can present menu items to the operator representing the operator's options in commanding the controller 222.

Figure 4:
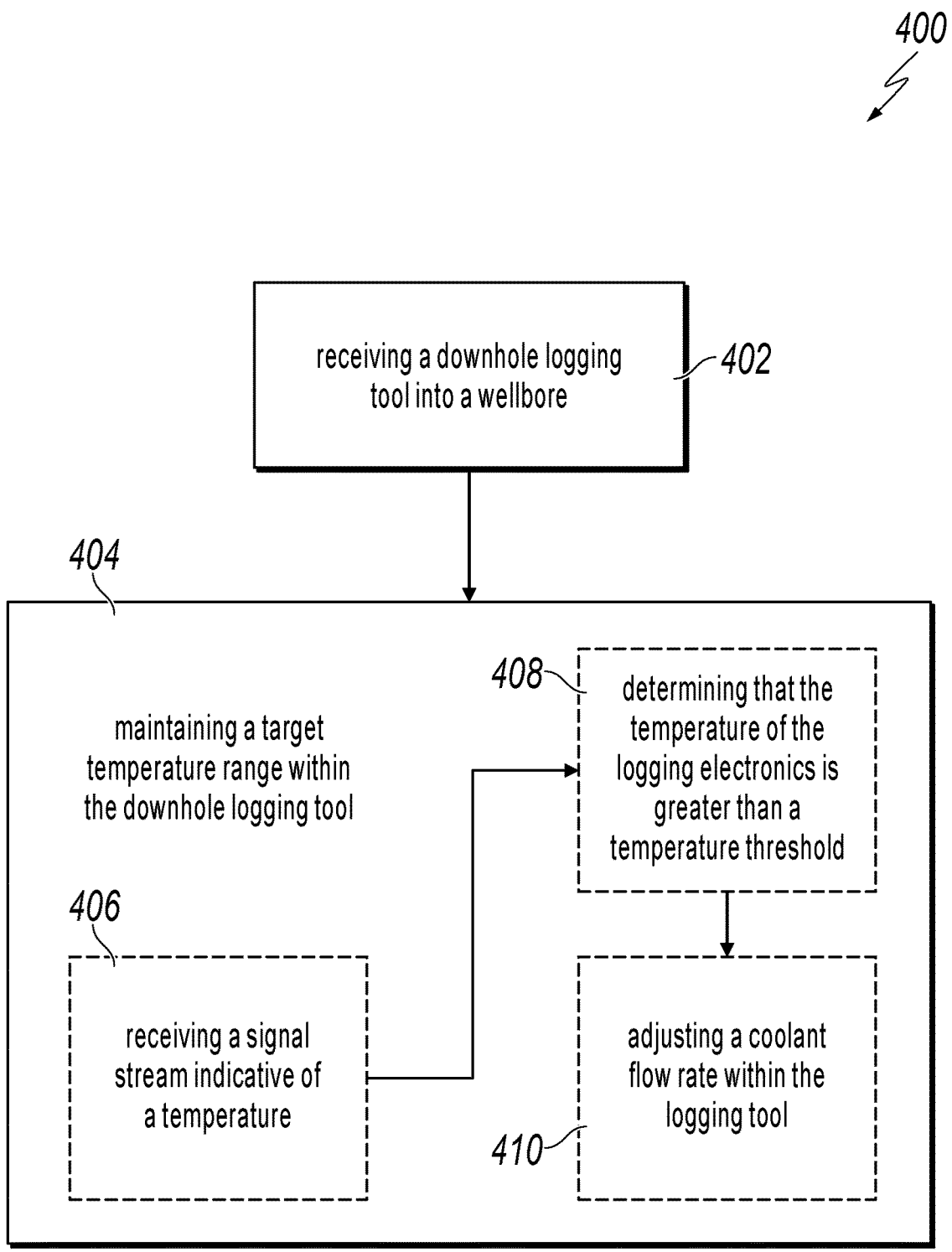
FIG. 4 is a flowchart of an example method that can be used with aspects of this disclosure.

FIG. 4 is a flowchart of an example method 400 that can be used with aspects of this disclosure. At 402, the downhole logging tool 108 is received into the wellbore 102. At 404, a target temperature range is maintained within the downhole logging tool 108. Maintaining a target temperature includes, at 406, receiving a signal stream from a temperature sensor 220, indicative of a temperature of logging electronics 202 within the logging tool 108. At 408, the temperature of the logging electronics 202 is determined to be greater than a temperature threshold. At 410, a coolant 208 flow rate within the logging tool 108 is adjusted in response to determining that a temperature of the logging electronics 202 is greater than the temperature threshold.

After the coolant 208 has been flowing for a period of time, in some instances, the signal stream indicative of the temperature of the logging electronics 202 is determined to be less than a temperature threshold. In such an instance, the coolant 208 flow within the logging tool 108 is ceased. In some implementations, such as when the downhole temperature exceeds the capacity of the wellbore 102, the signal stream indicative of the temperature of the logging electronics 202 is received after the coolant 208 has been flowing for a pre-determined duration of time. In general, the controller 222 compares a recorded cooling rate and a heating rate of the logging electronics 202 to determine a probability of successfully cooling the logging electronics 202. If the controller 222 determines that the logging electronics cannot be sufficiently cooled, then the logging electronics 202 are deactivated. In some instances, the temperature of the logging electronics 202 is determined to be greater than the temperature threshold. In such an instance, the logging electronics 202 within the logging tool 108 are deactivated responsive to the temperature of the logging electronics 202 being greater than the temperature threshold. In some instances, a status of the logging tool 108 is communicated to the topside facility indicative of the ceased coolant 208 flow and excessive temperature. In some instances, the logging electronics 202 can compile the recorded data and either send the recorded data to the topside facility as top energy usage priority, or the logging system can compile the recorded data to be stored within an onboard memory storage system to be retrieved when tool is back at the topside facility.

While this disclosure contains many specific implementation details, these should not be construed as limitations on the scope of any inventions or of what may be claimed, but rather as descriptions of features specific to particular implementations. Certain features that are described in this disclosure in the context of separate implementations can also be implemented in combination or in a single implementation. Conversely, various features that are described in the context of a single implementation can also be implemented in multiple implementations separately or in any suitable subcombination. Moreover, although features may have been previously described as acting in certain combinations and even initially claimed as such, one or more features from a claimed combination can, in some cases, be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the implementations previously described should not be understood as requiring such separation in all implementations, and it should be understood that the described components and systems can generally be integrated together in a single product or packaged into multiple products.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or a sequential order, to achieve desirable results.

What is claimed is:

1. A wellbore logging tool comprising:
   logging electronics housed within a tool housing;
   a first coolant reservoir housed within the tool housing;
   a second coolant reservoir housed within the tool housing, the logging electronics being between the first coolant reservoir and the second cooling reservoir, the first coolant reservoir and the second coolant reservoir being on opposite sides of the logging electronics from one another;
   a first tubing length defining a first coolant passage, the first tubing length fluidically connecting the first coolant reservoir, at a first end of the first tubing length, to the second coolant reservoir at a second end of the first tubing length, a portion of the first tubing length being adjacent to the logging electronics, the first tubing length being separate from the first coolant reservoir and the second coolant reservoir, wherein the first tubing length comprises a coiled section surrounding the logging electronics;
   a flow regulator within the first coolant passage, the flow regulator regulating a coolant flow between the first coolant reservoir and the second coolant reservoir;
   a second tubing length defining a second coolant passage, the second tubing length fluidically connecting the first coolant reservoir to the second coolant reservoir; and
   a check valve within the first coolant passage or the second coolant passage, the check valve arranged such that the coolant flows in only a single direction through the first coolant reservoir, the first tubing length, the second coolant reservoir, and the second coolant passage.

2. The wellbore logging tool of claim 1, further comprising:
a temperature sensor within the tool housing, the temperature sensor configured to produce a temperature signal stream indicative of a temperature of the logging electronics.

3. The wellbore logging tool of claim 2, further comprising a controller within the tool housing, the controller configured to:
receive the signal stream indicative of the temperature of the logging electronics;
determine that the temperature of the logging electronics is greater than a temperature threshold; and
adjust the flow regulator to flow coolant through the first tubing length responsive to determining that the temperature of the logging electronics is greater than the temperature threshold.

4. The wellbore logging tool of claim 3, wherein the controller is further configured to:
determine that the temperature of the logging electronics is less than a temperature threshold; and
adjust the flow regulator to cease coolant flow through the first tubing length.

5. The wellbore logging tool of claim 3, wherein the controller is further configured to:
receive the signal stream indicative of the temperature of the logging electronics after the coolant has been flowing for a pre-determined duration of time;
determine that the temperature of the logging electronics is greater than the temperature threshold; and
deactivate downhole electronics within the logging tool responsive to the temperature of the logging electronics being greater than the temperature threshold.

6. The wellbore logging tool of claim 1, wherein the flow regulator comprises a compressor configured to flow the coolant between the first coolant reservoir and the second coolant reservoir.

7. The wellbore logging tool of claim 1, wherein the flow regulator comprises a valve configured to flow the coolant between the first coolant reservoir and the second coolant reservoir.

8. The wellbore logging tool of claim 7, wherein the valve comprises a ball valve or butterfly valve.

9. The wellbore logging tool of claim 7, wherein the valve comprises Inconel.

10. The wellbore logging tool of claim 1, wherein the coolant comprises carbon dioxide.

11. The logging tool of claim 1, wherein the first reservoir is uphole of the logging electronics and the second reservoir is downhole of the logging electronics.

12. A method comprising:
receiving a downhole logging tool into a wellbore; and
maintaining a target temperature range within the downhole logging tool, wherein maintaining a target temperature comprises:
receiving a signal stream by a controller within the wellbore, from a temperature sensor, indicative of a temperature of logging electronics within the logging tool;
determining that the temperature of the logging electronics is greater than a temperature threshold; and
adjusting a coolant flow rate within the logging tool responsive to determining that the temperature of the logging electronics is greater than the temperature threshold, the coolant being fully contained within the logging tool, a coolant flow flowing through a tubing length comprising a coiled section surrounding the logging electronics.

13. The method of claim 12, wherein maintaining a target temperature comprises:
determining that the signal stream indicative of the temperature of the logging electronics is less than a temperature threshold; and
ceasing the coolant flow within the logging tool.

14. The method of claim 12, wherein maintaining a target temperature comprises:
receiving the signal stream, by the controller within the wellbore, indicative of the temperature of the logging electronics after the coolant has been flowing for a pre-determined duration of time;
determining that the temperature of the logging electronics is greater than the temperature threshold; and
deactivating the logging electronics within the logging tool responsive to the temperature of the logging electronics being greater than the temperature threshold.

15. A wellbore logging system comprising:
a logging tool housing;
logging electronics within the logging tool housing;
a temperature sensor within the tool housing, the temperature sensor configured to produce a temperature signal stream indicative of a temperature of the logging electronics;
a cooling system within the logging tool housing, the cooling system comprising:
a first coolant reservoir housed within the tool housing, the first coolant reservoir being uphole of the logging electronics;
a second coolant reservoir housed within the tool housing, the second cooling reservoir being downhole of the logging electronics;
a tubing length defining a coolant passage, the tubing length fluidically connecting the first coolant reservoir, at an uphole end of the tubing length, to the second coolant reservoir at a downhole end of the tubing length, the tubing length being separate from the first coolant reservoir and the second coolant reservoir, wherein the tubing length comprises a coiled section surrounding the logging electronics; and
a flow regulator within the coolant passage, the flow regulator regulating a coolant flow between the first coolant reservoir and the second coolant reservoir; and
a controller within the housing, the controller electronically coupled to the logging electronics, the temperature sensor, and the cooling system, the controller configured to:
receive the signal stream indicative of the temperature of the logging electronics;
determine that the temperature of the logging electronics is greater than a temperature threshold; and
adjust the flow regulator to flow coolant through the tubing length.

16. The wellbore logging system of claim 15, wherein the flow regulator comprises a compressor configured to flow the coolant between the first coolant reservoir and the second coolant reservoir.

17. The wellbore logging system of claim 15, wherein the flow regulator comprises a restriction orifice.

18. The wellbore logging system of claim 15, wherein the coolant comprises ammonia or nitrogen.

19. The wellbore logging system of claim 15, wherein the coolant comprises dry ice.

\* \* \* \* \*